United States Patent [19]

Sugie et al.

[11] Patent Number: 4,607,178
[45] Date of Patent: Aug. 19, 1986

[54] RESET SIGNAL GENERATING CIRCUIT

[75] Inventors: Mamoru Sugie; Takashi Toyooka, both of Sayama; Hirokazu Aoki, Hachioji; Kazutoshi Yoshida; Shinsaku Chiba, both of Mobara, all of Japan

[73] Assignee: Hitachi, Ltd., Tokyo, Japan

[21] Appl. No.: 520,012

[22] Filed: Aug. 3, 1983

[30] Foreign Application Priority Data

Aug. 13, 1982 [JP] Japan .................................. 57-141512

[51] Int. Cl.⁴ .......................................... H03K 17/284
[52] U.S. Cl. .................................. 307/594; 307/200 B; 307/362; 307/601; 307/605
[58] Field of Search ................ 307/200 A, 200 B, 443, 307/448, 451, 354, 362-363, 571, 573, 577, 580, 584, 264, 591, 246, 594, 601, 605

[56] References Cited

U.S. PATENT DOCUMENTS

| | | | |
|---|---|---|---|
| 4,103,187 | 7/1978 | Imamura | 307/200 B X |
| 4,140,930 | 2/1979 | Tanaka | 307/362 |
| 4,196,362 | 4/1980 | Maehashi | 307/363 X |
| 4,296,338 | 10/1981 | Thomas | 307/362 |
| 4,300,065 | 11/1981 | Remedi et al. | 307/571 |
| 4,309,627 | 1/1982 | Tabata | 307/362 |
| 4,385,245 | 5/1983 | Ulmer | 307/362 X |
| 4,405,871 | 9/1983 | Buurma et al. | 307/362 X |
| 4,520,418 | 5/1985 | Susi | 307/200 A X |
| 4,536,667 | 8/1985 | Masuda | 307/200 A X |

OTHER PUBLICATIONS

Savalgi et al, "Let 'Power-On' Generate a Noise-Free Transition Pulse", EDN, Nov. 1976, p. 86.

Primary Examiner—Stanley D. Miller
Assistant Examiner—D. R. Hudspeth
Attorney, Agent, or Firm—Antonelli, Terry & Wands

[57] ABSTRACT

A semiconductor integrated circuit receiving at its input pin the terminal voltage of a capacitor which is connected to a power source through a resistor so as to detect the level of the power voltage. The circuit is provided with a level shift circuit which shifts the incoming power voltage level by a predetermined value so that a reset signal is produced by detecting the output of the level shift circuit falling below the threshold level of a logic circuit.

2 Claims, 7 Drawing Figures

RESET SIGNAL GENERATING CIRCUIT

BACKGROUND OF THE INVENTION

The present invention relates to a semiconductor integrated circuit and, particularly, to a semiconductor integrated circuit capable of generating a reset signal reliably when power failure has occurred and also when the power voltage is built up slowly.

The magnetic bubble memory is attractive due to its various advantages such as high storage density, non-volatility and low power dissipation, and the development for putting it into practice is now under way. The magnetic bubble memory must be nonvolatile even in the occurrence of power failure or disconnection of the power source. The magnetic bubble memory is generally accompanied by an electronic circuit such as a bubble memory controller for controlling and driving memory cells, and if the circuit operates inordinately upon the occurrence of power failure, non-volatility of the bubble memory will be lost. Namely, upon the occurrence of power failure, the control circuit detects the power voltage falling below a certain level and performs a specified process. On the other hand, however, if the power voltage recovers before falling down to 0 volt, the power-ON reset circuit does not operate and the control circuit cannot start normally.

This is a problem which can occur not only in the magnetic bubble memory, but also in any electronic circuit which performs sequential control and is required to be prevented from abnormally operating at the occurrence of power failure.

For example, it has been a common practice in semiconductor integrated circuits such as microcomputers to constantly provide a charging current for a capacitor 3 from a power source 1 through a resistor 2 of high resistance, and apply the voltage appearing across the capacitor 3 to an integrated circuit 10 through an input pin 5 as shown in FIG. 1A. A diode 4 is used to discharge the capacitor 3 quickly. A logical gate or Schmitt trigger circuit 6 is provided within the integrated circuit 10 so that it generates a reset signal "RESET" when the voltage at the input pin falls below a certain level, thereby preventing the integrated circuit 10 from malfunctioning.

The Schmitt trigger circuit 6 is a bistable circuit operating along the S-shaped curve (hysteresis curve) as shown in FIG. 1B, and the circuit provides an output voltage $V_0$ at a low level $V_L$ for an input voltage $v$ below $V_1$ and the output voltage $V_0$ makes a quick transition to a high level $V_H$ when the input voltage $v$ goes above the level $V_1$. Furthermore, when the input voltage $v$ is initially higher than $V_1$, the output voltage $V_0$ maintains the high level $V_H$ for an input voltage above $V_2$ and it makes a quick transition to the low level $V_L$ when the input voltage falls below the level $V_2$.

Accordingly, by the operation of making the output voltage $V_0$ rise to the high level $V_H$ when the supply voltage $v$ reaches $V_1$, the reset signal can be released, and by the operation of making the output voltage $V_0$ fall to the low level $V_L$ when the supply voltage $v$ falls abnormally below $V_2$, the reset signal can be activated.

However, the reset signal generating circuit shown in FIG. 1A uses the input voltage signal derived from the voltage of the power source 1 with its build-up being delayed by the CR delay circuit consisting of the resistor 2 and capacitor 3, and therefore, if the power source voltage during the power-ON operation is built up at a slower rate relative to the CR time constant, or if the power voltage falls due to an abnormality at a slower rate relative to the CR time constant, the input voltage signal at the input pin 5 will be substantially the same as the power voltage. Accordingly, in most cases, the logic circuit within the integrated circuit 10 has already lost its normal operation and can not generate the reset signal normally by the time the signal level at the input pin 5 reaches the threshold level of the receiving logic circuit.

There is proposed a logic circuit which, when the power voltage falls abnormally or the power source has been disconnected, memorizes the logical states immediately before the time when the normal voltage is lost and restarts the logical operation on the basis of the memorized logical states when the power voltage is restored, as disclosed in Japanese Patent Application Laid-open No. 119534/75. This circuit has a voltage detector 23, as shown in FIG. 2A, which detects the abnormal fall in the voltage of a power source 1 to deenergize a normally operating relay 24 so that a capacitor 3 is disconnected from ground. This allows the capacitor 3 to gradually discharge its stored electric charge through a resistor 21 of high resistance, whereby the electric charge immediately before the abnormal voltage fall can be held for a long time.

As shown by V in FIG. 2B, when the power voltage returns to a normal voltage above a certain level $V_R$, the detector 23 energizes the relay 24 and, at the same time, activates a pulse generator 7 to generate a single pulse 25 so that an AND gate 9 is disabled through an inverter 8. Consequently, the input signal "IN" is inhibited from the entry to the logic circuit, and the charged voltage corresponding to the logical level of the IN signal immediately before the abnormal fall in the power voltage is applied through the resistor 21 to the buffer amplifier 22 and sent out as an output signal "OUT". The arrangement of FIG. 2A can operate the relay 24 and pulse generator 7 at an exact time point even if the power voltage falls or rises slowly. However, it is difficult to pack the relay 24 and the associated contacts 24' within the package of the integrated circuit.

The following reference is cited to show the state of the art:

Japanese Patent Application Laid-open No. 119534/75.

SUMMARY OF THE INVENTION

It is an object of the present invention to overcome the foregoing prior art deficiencies and provide a semiconductor integrated circuit which generates a reset signal stably at the occurrence of abnormal power voltage with which the logic circuit within the integrated circuit cannot operate normally, whereby malfunctioning of the logic circuit is prevented.

In order to achieve the above object, the inventive semiconductor integrated circuit resides in the arrangement for applying the voltage across a capacitor, which is connected to the power source through a resistor, to the input pin as a signal having a power voltage level, wherein the arrangement is provided with a level shift circuit which shifts the level of the input power voltage by a predetermined value, and a reset signal is generated for the internal use or external use i.e. for the use inside of the integrated circuit or outside of it when the output or the level shift circuit is detected to be below the threshold level of the logic circuit.

DESCRIPTION OF THE PREFERRED EMBODIMENT

The inventive semiconductor integrated circuit will now be described in detail by way of embodiment.

Figure 1A:
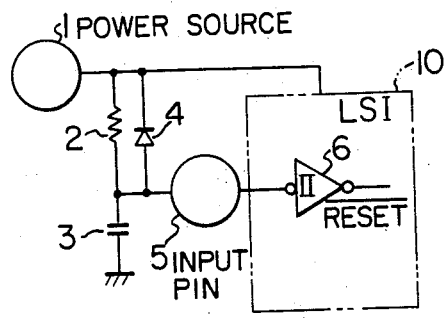
FIGS. 1A, 1B and 1C are diagrams showing the arrangement and operation of the conventional reset signal generating circuit.
Figure 1B:
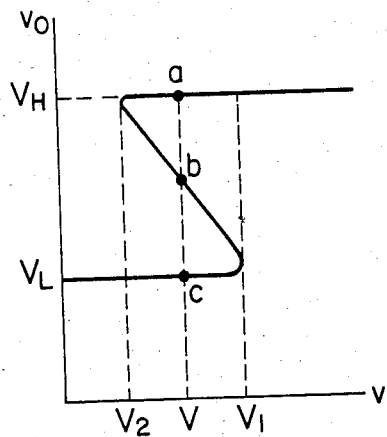
Figure 1C:
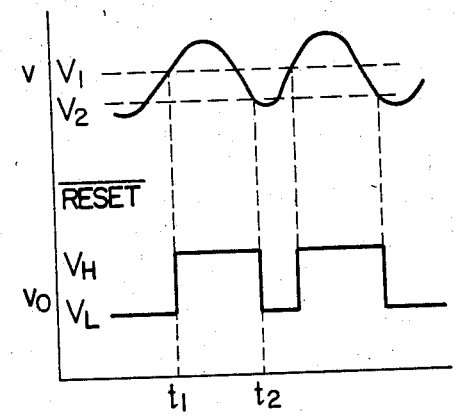
Figure 2A:
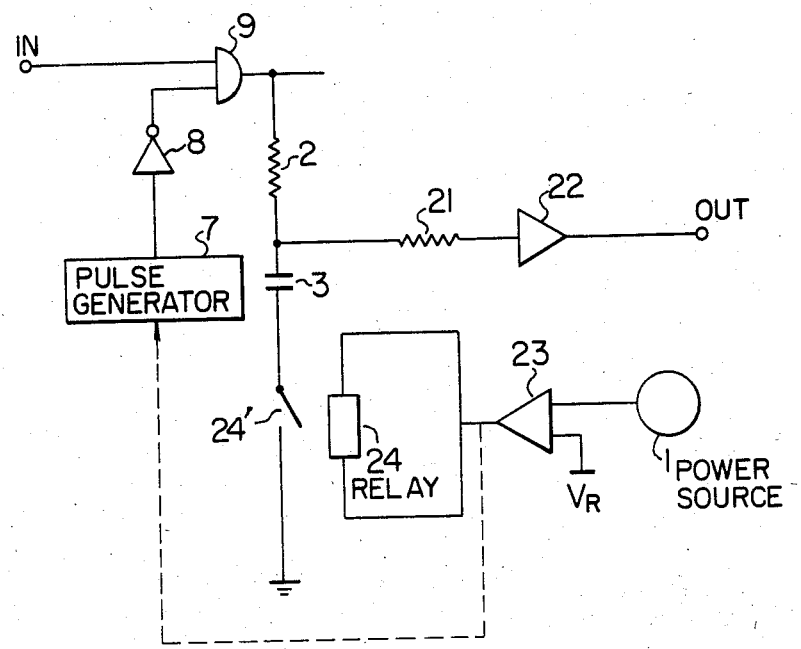
FIGS. 2A and 2B are diagrams showing the arrangement and operation of the conventional logical state memorizing circuit.
Figure 2B:
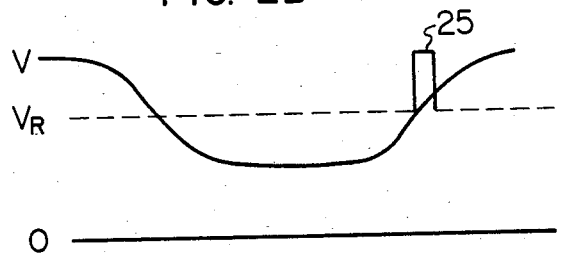
Figure 3A:
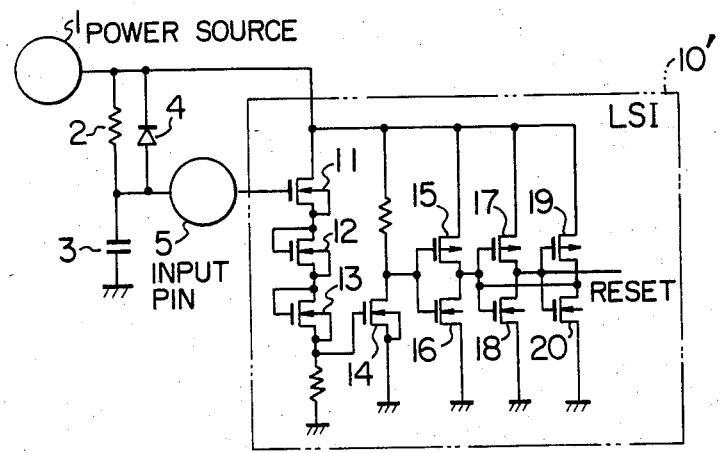
FIGS. 3A and 3B are diagrams showing the arrangement and operation of the reset signal generating circuit embodying the present invention.
Figure 3B:
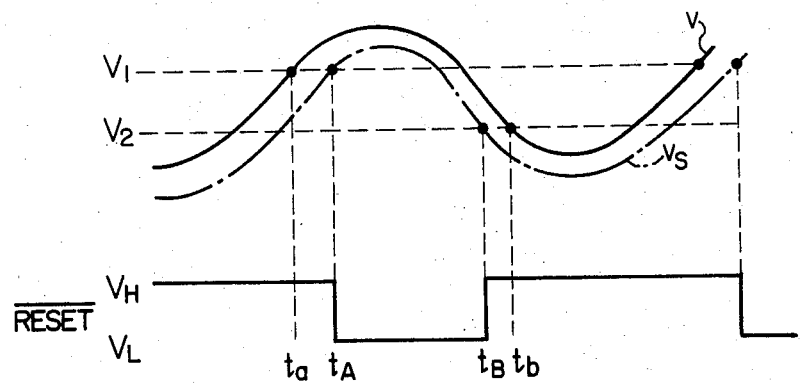

FIGS. 3A and 3B are schematic diagram and waveform diagram showing the arrangement and operation of the semiconductor integrated circuit embodying the present invention. An integrated circuit 10' shown in FIG. 3A receives a signal through an input pin 5 and provides a reset signal RESET by the arrangement including a level shift circuit composed of an n-MOS transistor 11, MOS diodes 12 and 13 and a resistor 26, an inverter composed of an n-MOS transistor 14 and a resistor 27, and a Schmitt trigger circuit composed of a CMOS inverter comprised of a p-MOS transistor 15 and a n-MOS transistor 16, a CMOS inverter composed of a p-MOS transistor 17 and a n-MOS transistor 18 and a CMOS inverter composed of a p-MOS transistor 19 and a n-MOS transistor 20. In the integrated circuit 10', the level of the input signal is shifted by the level shift circuit so that the shifted signal reaches a first threshold level $V_1$ behind by a predetermined time length when the input signal rises up and the shifted signal reaches a second threshold level $V_2$ in advance by a predetermined time length when the input signal voltage falls. Namely, the voltage signal is shifted by $\Delta V$ so that a change in the level of the input reset signal can be detected while the internal logic circuit still operates normally under the power voltage for the integrated circuit 10' which is higher by $\Delta V$ than the detected voltage, whereby logic circuits inside of and/or outside of the integrated circuit 10' can be reset normally.

In the integrated circuit 10' shown in FIG. 3A, an n-MOS transistor 11 forms a source follower and each of MOS diodes 12 and 13 is for shifting the input signal level. Assuming the threshold level of each n-MOS transistor to be $V_{THn}$, the level of the input signal is shifted by $3V_{THn}$ by the level shift circuit. The n-MOS transistor 14 forms an inverter along with the resistor 27, which prevents the logical output from reversing due to a change in the threshold level when the power voltage varies relative to the input voltage signal. The CMOS inverter composed of transistors 15 and 16 forms an inverter with its inputs having a power voltage level or ground level, and the logical output does not vary even if the threshold level of the inverter composed of the CMOS inverter formed of the transistors 15 and 16 varies due to the variation of the power voltage. The Schmitt trigger circuit is formed of the CMOS inverter formed of the transistors 17-20, providing two stable states by the positive feedback from the output of an inverter made up of transistors 19 and 20 to the input of another inverter made up of transistors 17 and 18.

In case the fall time of the power voltage is longer than the time constant determined by the values of the resistor and capacitor, the signal level at the input pin 5 is equal to the power voltage. The critical condition for the voltage signal which has been shifted down by $3V_{THn}$ to drive the following n-MOS transistor is expressed by the following equation.

$$V_{cc} - 3V_{THn} = V_{THn} \qquad (1)$$

where $V_{cc}$ is the power voltage and $V_{THn}$ is the threshold voltage of the n-MOS transistor.

Namely, the transition of the signal is detected when the power voltage $V_{cc}$ equals $4V_{THn}$. Commonly used CMOS circuits operate under $V_{cc} \geq V_{THn} + V_{THp}$, where $V_{THp}$ is the threshold voltage of the p-MOS transistor. Since $V_{THp}$ is nearly equal to $V_{THn}$, the logic circuit operates normally with the power voltage $V_{cc} = 4V_{THn}$ in which the transition of the signal can be detected even with the deviation of the parameters due to process variation taken into account.

The arrangement of FIG. 3A employs MOS diodes in the level shift circuit, resulting advantageously in a reduction of power consumption. The n-MOS inverter composed of the n-MOS transistor 14 provided at the stage preceding the Schmitt trigger circuit serves to prevent the logical output from reversing due to the variation of the threshold level of the CMOS inverter caused by the power voltage variation.

Referring to FIG. 3B, with the Schmitt trigger circuit composed of the CMOS inverter formed of the transistors 17 and 18 and CMOS the transistors 19 and 20 having threshold voltages of $V_1$ and $V_2$, if the power voltage varies as shown by v at a slower rate relative to the CR time constant, the voltage applied to the input pin 5 will be v. If the level shift circuit composed of the n-MOS transistor 11 and the MOS diodes 12 and 13 were not provided, the p-MOS transistor 15 in the Schmitt trigger circuit would become conductive at $t_a$ and the reset signal RESET would be released (become low level) when the power voltage v rises to $V_1$, and the n-MOS transistor 16 in the Schmitt trigger circuit would become conductive at $t_b$ and the reset signal RESET would be activated (become high level) when the power voltage falls to $V_2$.

With the provision of the level shift circuit composed of the n-MOS transistor 11 and the MOS diodes 12 and 13 and the inverter 14 as shown in FIGS. 3A and 3B, a voltage $v_s$ appears at the output of the n-MOS inverter 14. At a time point $t_A$ when the power voltage rises to bring $v_s$ equal to $V_1$, the CMOS inverter composed of the transistors 15 and 16 provide a high level output, causing the p-MOS transistor 15 in the Schmitt trigger circuit to become conductive and the reset signal RESET is released. At a time point $t_B$ when the power voltage falls to bring $v_s$ equal to $V_2$, the CMOS inverter composed of the transistors 15 and 16 provide a low (GND) level output, causing the n-MOS transistor 16 in the Schmitt trigger circuit to become conductive and the reset signal RESET is released. Namely, as can be seen obviously from FIG. 3B, even if the power voltage rises or falls slower relative to the CR time constant, the Schmitt trigger circuit operates while the power voltage is high enough for the logic circuit within the integrated circuit to operate normally, and thus the reset signal can be produced reliably.

According to the present invention, as described above, the reset signal is generated with the power voltage range operable for the logic circuit within the integrated circuit by the arrangement of shifting the voltage level of the input signal, whereby the integrated circuit is prevented effectively from malfunctioning in the occurrence of power failure or slow build-up of the power voltage.

We claim:

1. A reset signal generating circuit for use in a semiconductor integrated circuit powered by a power source, comprising:

delay means to be connected to said power source for producing a delayed voltage changing with a delay as the supply voltage of said power source changes, said delay means including a resistor, a capacitor connected to said power source through said resistor and a diode connected in parallel with said resistor, said delayed voltage being produced across said capacitor;

a terminal connected to said capacitor for receiving said delayed voltage;

level shift means, connected to said terminal, for shifting said delayed voltage by a predetermined voltage level including a first n-MOS transistor having a gate connected to said terminal and a drain to be connected to said power source, a first diode-connected n-MOS transistor having a drain connected to a source of said first n-MOS transistor, a second diode-connected n-MOS transistor having a drain connected to a source of said first diode-connected n-MOS transistor, and a first resistor connected between a source of said second diode-connected n-MOS transistor and ground, said shifted delayed voltage appearing at a first connection point connecting said first resistor and said source of said second diode-connected n-MOS transistor; and detecting means, connected to said level shift means, for detecting the level of said shifted delayed voltage to generate a reset signal when said shifted voltage is below a predetermined level, said reset signal being used to reset at least said integrated circuit, wherein said detecting means comprises:

an inverter including a second n-MOS transistor having a gate connected to said first connection point and a source connected to ground and a second resistor of high resistance having one end connected to a drain of said second n-MOS transistor and the other end to be connected to said power source; and a Schmitt-trigger circuit having an input connected to a second connection point connecting said one end of said second resistor and said drain of said second n-MOS transistor and an output outputting said reset signal.

2. A reset signal generating circuit according to claim 1, wherein said Schmitt-trigger circuit comprises:

a first CMOS inverter connected between said power source and ground and having an input connected to said second connection point;

a second CMOS inverter connected between said power source and ground and having an input connected to an output of said first CMOS inverter; and a third CMOS inverter having an input connected to an output of said second CMOS inverter and an output connected to said input of said second CMOS inverter, said reset signal appearing at said output of said second CMOS inverter.

* * * * *